(12) United States Patent
Madan et al.

(10) Patent No.: US 8,423,837 B2
(45) Date of Patent: Apr. 16, 2013

(54) HIGH RELIABILITY AND LOW POWER REDUNDANCY FOR MEMORY

(75) Inventors: Sudhir K. Madan, Richardson, TX (US); David J. Toops, Terrell, TX (US); Robert J. Landers, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 12/705,595

(22) Filed: Feb. 13, 2010

(65) Prior Publication Data

US 2010/0211853 A1    Aug. 19, 2010

Related U.S. Application Data

(60) Provisional application No. 61/152,554, filed on Feb. 13, 2009.

(51) Int. Cl.
*G06F 11/00* (2006.01)
*G11C 29/00* (2006.01)

(52) U.S. Cl.
USPC ........... 714/710; 714/711; 714/723; 714/763; 714/764; 714/768; 714/773; 714/54; 714/702

(58) Field of Classification Search ............... 714/54, 714/42, 701, 70, 711, 763, 723, 773, 768; 365/201
See application file for complete search history.

(56) References Cited

U.S. PATENT DOCUMENTS

| | | | | |
|---|---|---|---|---|
| 4,875,212 | A  * | 10/1989 | Hashimoto | 714/764 |
| 5,128,944 | A  * | 7/1992 | Flaherty et al. | 714/6.32 |
| 5,745,673 | A  * | 4/1998 | Di Zenzo et al. | 714/6.32 |
| 6,065,146 | A  * | 5/2000 | Bosshart | 714/754 |
| 7,042,752 | B2 * | 5/2006 | Okuda | 365/112 |
| 7,295,455 | B2 * | 11/2007 | Okuda | 365/112 |
| 7,426,683 | B2 * | 9/2008 | Takahashi et al. | 714/801 |
| 7,535,744 | B2 * | 5/2009 | Okuda | 365/112 |
| 8,032,815 | B2 * | 10/2011 | Namekawa et al. | 714/764 |
| 2006/0107130 | A1* | 5/2006 | Baker et al. | 714/710 |
| 2007/0033449 | A1* | 2/2007 | Hwang et al. | 714/710 |
| 2007/0255981 | A1* | 11/2007 | Eto | 714/710 |
| 2008/0016427 | A1* | 1/2008 | Namekawa et al. | 714/758 |
| 2008/0031031 | A1* | 2/2008 | Okuda | 365/112 |
| 2010/0070696 | A1* | 3/2010 | Blankenship | 711/105 |

* cited by examiner

*Primary Examiner* — Guerrier Merant
(74) *Attorney, Agent, or Firm* — Rose Alyssa Keagy; Wade J. Brady, III; Frederick J. Telecky, Jr.

(57) ABSTRACT

An integrated circuit containing a memory array, a redundancy circuit and a redundancy error correction circuit coupled to said redundancy circuit. A method for constructing a redundancy word which corresponds to each memory segment and a method for error checking the redundancy word during a memory access request.

19 Claims, 5 Drawing Sheets

US 8,423,837 B2

HIGH RELIABILITY AND LOW POWER REDUNDANCY FOR MEMORY

CROSS-REFERENCE TO RELATED APPLICATIONS

This application claims the benefit of priority under U.S.C. §119(e) of U.S. Provisional Application 61/152,554, filed Feb. 13, 2009.

FIELD OF THE INVENTION

This invention relates to the field of integrated circuits. More particularly, this invention relates to redundancy in memories.

DETAILED DESCRIPTION

Figure 1:
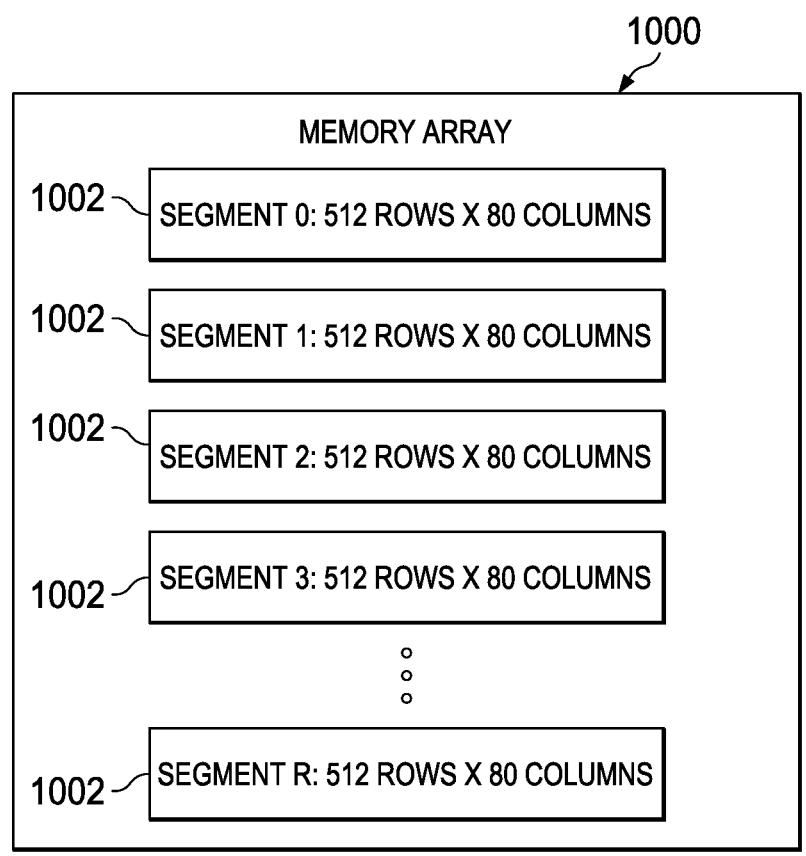
FIG. 1 (Prior art) is a block diagram of a memory circuit.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The term "data array" refers to a memory array and associated circuitry which is used to store data and programs. The data array may include a memory array, wordline and bitline drivers, and built in self test (BIST) circuitry.

The term "redundancy memory" refers to memory that is reserved for redundancy memory operations. This memory may be the same as the data array or may be different. For example, an integrated circuit with an FRAM data array may have an SRAM redundancy memory.

An integrated circuit containing a data array with redundancy and error correction for the redundancy words is described. Each redundancy word stored in the redundancy memory corresponds to a memory segment in the data array and contains the information regarding bad rows and/or bad columns in that data memory segment. When data from a data address is requested from a given memory segment in the data array, the segment address portion of the data address is sent to the redundancy memory circuit and the redundancy word corresponding to the segment address portion of the data address is read. By assigning one redundancy word to each data memory segment, the parallel checking that occurs in conventional CAM redundancy circuits is avoided, thereby saving power. The redundancy word is then sent to an error correction circuit (ECC) for verification. As an example, the ECC verification process may involve processing the redundancy word through an ECC circuit with double-bit error detection (DED) and single bit error correction (SEC). In the case of an SRAM redundancy memory, this type of ECC verification may improve reliability by ensuring any single-bit error that may be been generated in the redundancy word due to a soft error (SER) is corrected at the read out. After ECC verification the redundancy word is compared with the requested data address to determine if there is an address match. An address match indicates the presence of a bad row or a bad column in the data array, in which case the request is rerouted to a redundant good row and/or redundant good column in the data array. In the case of an SRAM redundancy memory, each redundancy SRAM word may be rechecked by the ECC for errors after a predetermined number of accesses to prevent errors from building up over time due to SER. If errors are found the redundancy words may be rewritten into the SRAM redundancy memory.

The term "corresponding redundancy word" refers to a redundancy word that corresponds to a data memory segment. Each data memory segment may have a corresponding redundancy word that contains information about the location of bad bits (such as bad rows and bad columns) in the data memory segment that require repair.

The schematic block diagram in FIG. 1 illustrates a memory array (1000). The memory array is composed of memory segments (1002) 0 through R where R is a positive integer. In this illustrative example each segment consists of 80 columns and 513 rows of memory bits where each row spans all 80 columns. Segments with a different number of rows and columns may also be used. One or more of the rows and columns in each segment may be reserved as redundant rows or columns for repair of bad rows or columns that may be in the data memory segment. For example each data memory segment (1002) may contain one redundant row and one redundant column per word width. In the example of an 80 column wide segment, there may be two sets of the following in each row: Thirty two columns containing a 32 bit word, seven columns containing 7 ECC bits plus a redundant column containing a redundant bit. The use of seven ECC bits will enable double bit error detection and single bit error correction for a 32 bit word. The redundant column may be used to replace a bad bit in the 32 bit data word or the in the 7 ECC bits. The 513 rows in this illustrative example may consist of 512 data rows and one redundant row.

Figure 2:
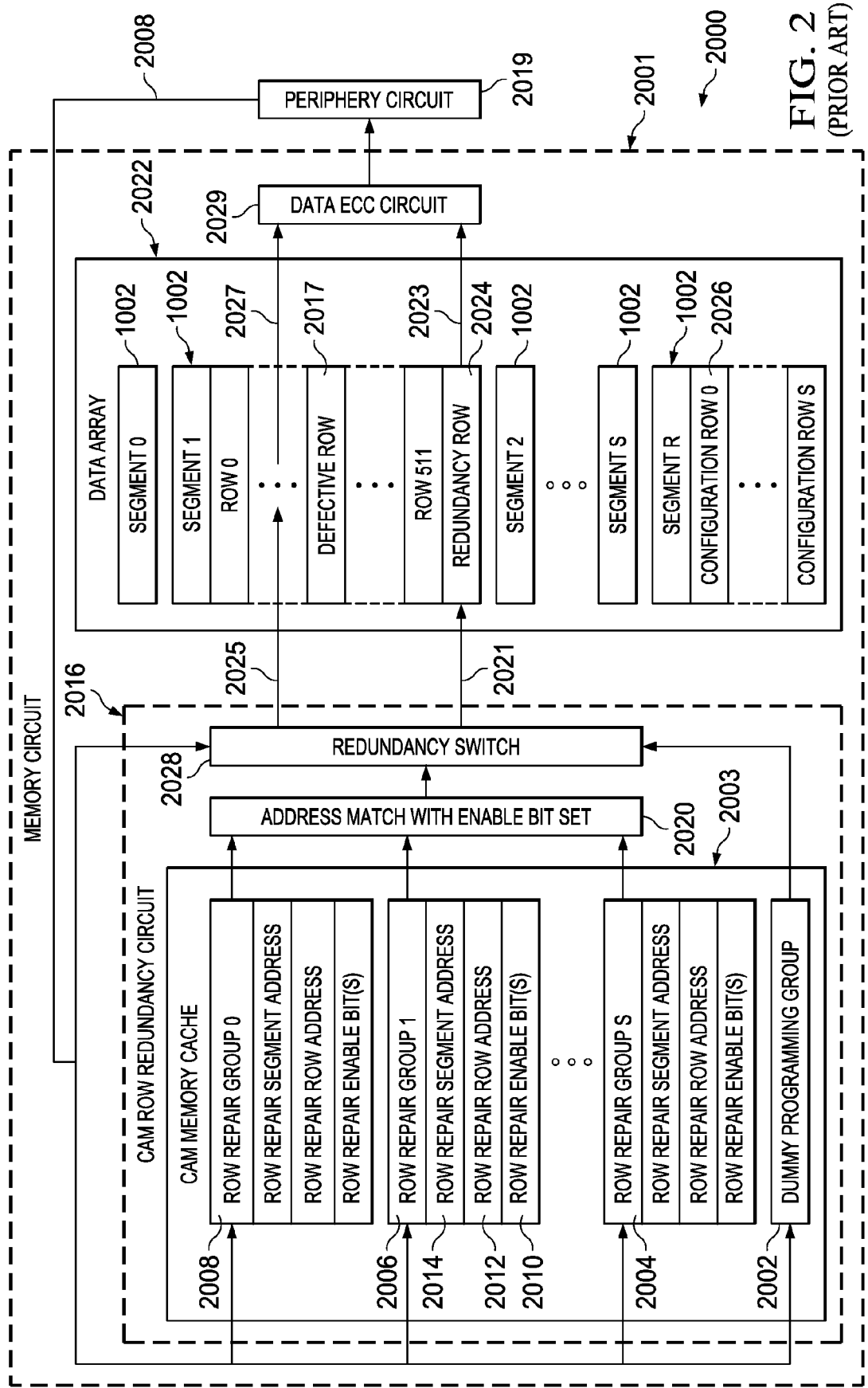
FIG. 2 (Prior art) is a block diagram of a memory circuit with CAM redundancy

A block diagram of a portion of an integrated circuit (2000) with a memory circuit (2001) containing a data array (2022) (that includes memory segments 1002) and a conventional content addressable memory (CAM) row redundancy circuit (2016) is shown in FIG. 2. Row redundancy is described here for illustrative purposes. Column or bit redundancy could equally well have been used. The CAM row redundancy circuit includes a CAM memory cache (2003), an address matching circuit (2020), and a redundancy switch circuit (2028). Within the CAM memory cache (2003) are row repair group-0 (2008) through row repair group-S (2004) where S is a positive integer. Each row repair group may contain memory bits which contain information about a row with defective bits. The information includes the segment address (2014), row address (2012), and repair enable bits (2010). The repair enable bits, 2010, indicates if repair in the segment, 2014, is required. If the repair enable bit is set to false than a repair is not done.

Defective rows (2017) are typically detected during final test at the chip manufacturer and those addresses are written into configuration rows (2026) in a data array (2022) that may be a nonvolatile data array (such as FRAM or EEPROM) or those addresses are written into e-fuses in the case of a volatile data array (such as SRAM or DRAM). These configuration rows (2026) or e-fuses are used to store redundancy information and are also referred to as configuration storage elements. At power up the defective row information is written into the CAM memory cache's (2003) memory repair groups; group-0 (2008) through group-S (2004)).

When the periphery circuit (2019) sends a memory access request (2008), requesting data from an address in data array (2022), the data request (2008), which contains segment and data address information, is sent in parallel to each row repair group (2008), (2006), . . . (2004). The data request address is compared in parallel to the segment address (2014) and row address (2012) in each row repair group (2008), (2006), and (2004), to see if there is a match. At the start of the comparison, a trigger signal is also sent to the dummy programming group (2002) that starts a self timed circuit. This self timed circuit allows sufficient time for the address comparison in each of the row repair groups to be completed and also allows time for the repair enable bit to be set in address matching circuit (2020) before sending a signal to the redundancy switch circuit (2028). The repair enable bit is set to true in address match circuit (2020) when an address match to the data request (2008) is found (indicating that a row repair is required). For illustrative purposes, a match between the data request the row repair segment address (2014) and row repair row address (2012) occurs in row repair group 1 (2006). The match in repair group 1 sets the repair enable bit to true, indicating that the data in the row of the data request is defective (2017).

When redundancy switch (2028) receives a signal from the dummy programming group (2002) that indicates that the data from address match circuit (2020) is ready to process, then redundancy switch (2028) redirects the data path (2021) to the redundancy row (2024) if the repair enable bit is set to true (indicating that a repair is needed). After the correct data is read from the redundancy row (2024), the data may proceed along data path (2023) to ECC circuit (2029), where it may be checked for errors before being sent to periphery circuit (2019). Alternatively, if the repair enable bit is set to false (indicating that the data request address contains correct data), then redundancy switch (2028) sends the data request along data path (2025) to the requested address in data array (2022). The correct data may then be read from the address in the data request and it may proceed along data path (2027) to ECC circuit (2029), where it may be checked for errors before being sent to the periphery circuit (2019).

Each of the repair groups, group-0 (2008) through group-S (2004), and the dummy programming group (2002) consumes power when performing the address comparison in parallel. Also, when the redundancy CAM is an SRAM-based memory, the data in the repair groups, (2008) through (2004), may be corrupted due to soft error events (such as cosmic ray and or alpha particle events). Soft error events may cause the repair information stored in the CAM memory cache (2003) to become unreliable. Therefore, a commonly measured parameter of SRAM arrays is the soft error rate ("SER"), which is a measure of the number of soft error events versus time.

An FRAM data array with an SRAM redundancy memory is used to illustrate this embodiment, but other types of memories may be used for the data array and the redundancy memory. For example, nonvolatile memories such as FLASH or EEPROM or volatile memories such as SRAM or DRAM may also be used for the data array and the redundancy memory. When the data array is a nonvolatile memory, the redundancy words may be written into and stored in configuration rows within the nonvolatile memory. When the data array is a volatile memory, the redundancy words may be stored in a reprogrammable nonvolatile memory array (such as EPROM or FRAM) or may be stored in one time programmable nonvolatile memory (by blowing electrically programmable fuses (e-fuses) or antifuses).

Figure 3:
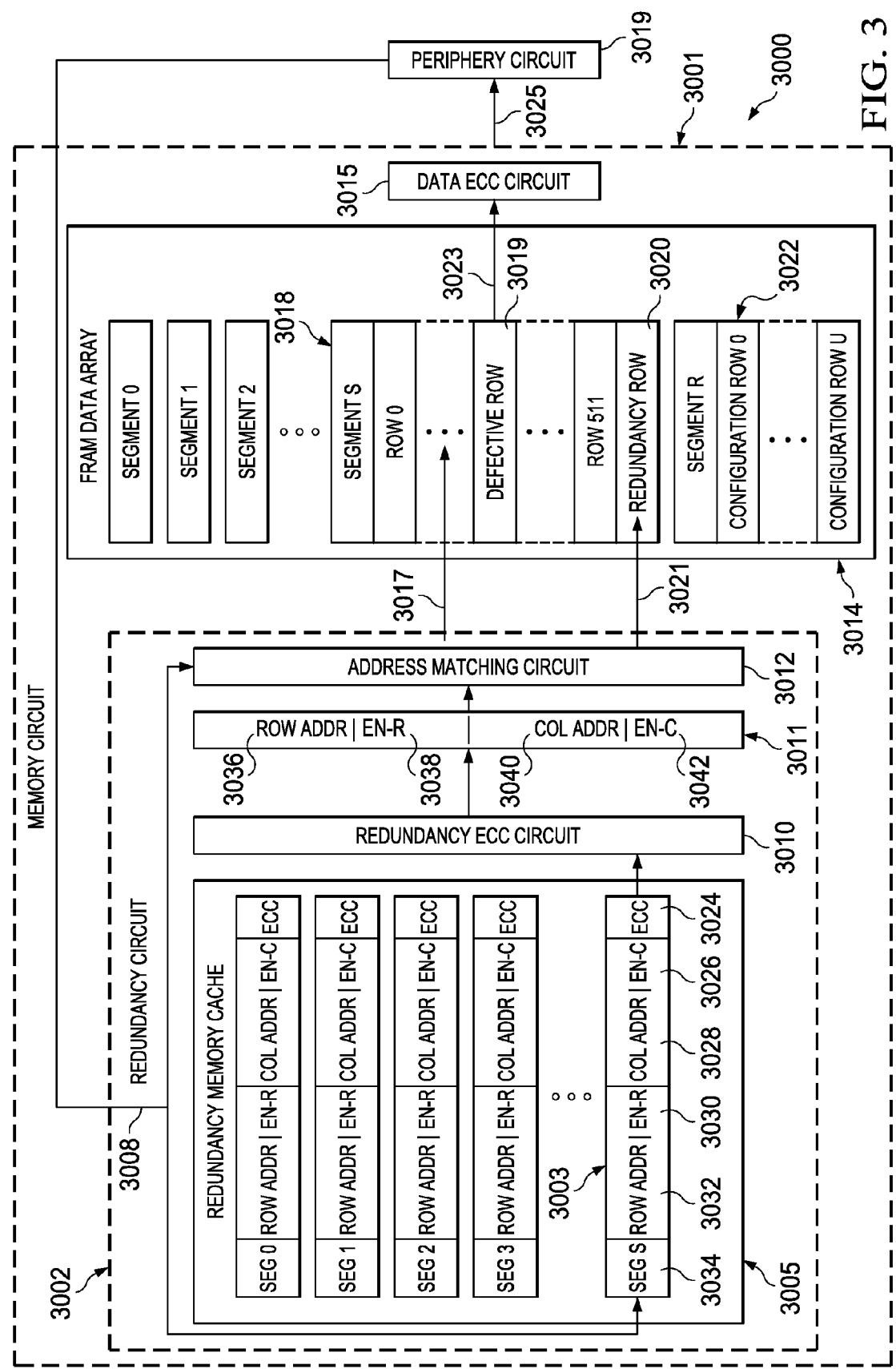
FIG. 3 is a block diagram of an FRAM memory circuit with SRAM redundancy and error correction according to an embodiment.
Figure 5:
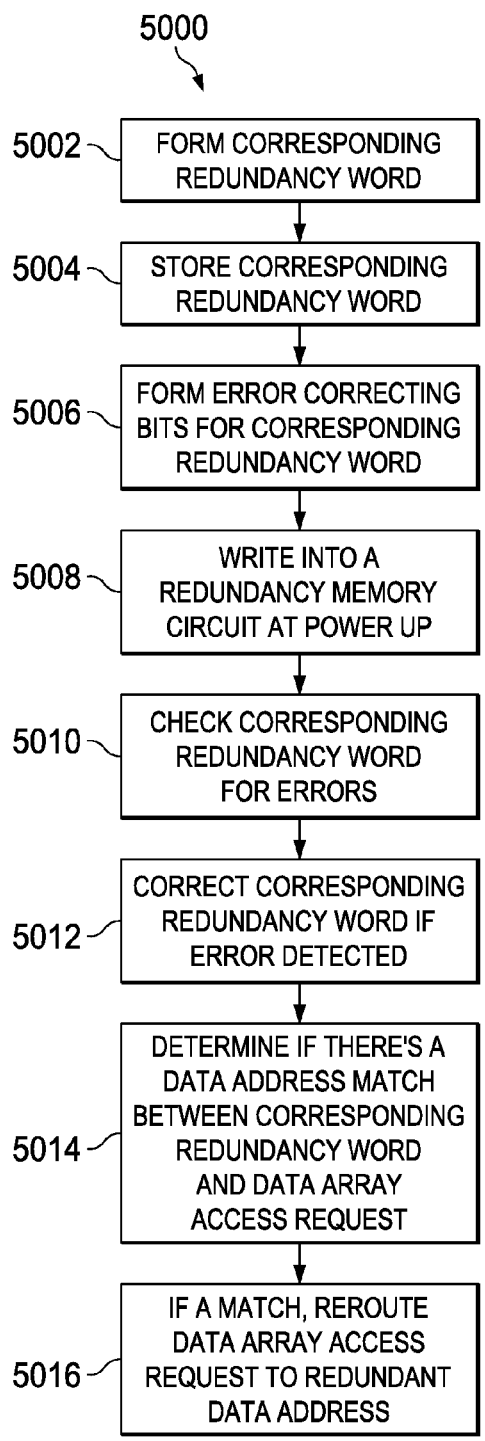
FIG. 5 is a method for operating the FRAM memory circuit with SRAM redundancy and error correction that is shown in FIG. 3.

FIG. 3 is an illustrative embodiment of a portion of an integrated circuit (3000) with a memory circuit (3001) containing an FRAM data array (3014) and a redundancy circuit (3002). FIG. 5 shows an associated method for operating the integrated circuit (3000). The redundancy circuit (3002) includes a redundancy memory cache (3005) (which may be SRAM), a redundancy error correction circuit (3010), and an address matching circuit (3012). Each redundancy word (3003) in the redundancy memory cache (3005) is associated with a segment in the FRAM data array (3014) and is referred to as a corresponding redundancy word. For example, corresponding redundancy word (3003), labeled SEG S (3034) in the redundancy memory cache (3005), may have a one-to-one correspondence with memory segment S (3018) in FRAM data array (3014). Associating a redundancy word with each memory segment avoids the need to check each word in the redundancy memory for a possible match as is the current practice in a conventional CAM. This may significantly reduce power and memory access time.

The data in a corresponding redundancy word (3003) contains the row address (3032) information concerning the defective row (3019) plus its corresponding row repair enable bit, EN-R (3030), plus error correction (ECC) bits (3024), for the data in stored in the redundancy word (3003). It may also contain defective column address information (3028) plus its corresponding column repair enable bit, EN-C (3026). ECC bits (3024) may, for example, contain parity bits for single bit error correction and for double bit error detection for redundancy word (3003). The length of the corresponding redundancy word (3004) determines the number of rows and columns or bits that may be repaired. The present example shows single row and/or single column replacement, but the redundancy scheme may be adapted to replace multiple rows and/or columns, portions of a row and/or column, or single bits and/or multiple bit clusters.

Referring now to FIGS. 3 and 5 simultaneously; the information regarding data addresses that require repair (step 5002) may be written (step 5004) into configuration rows (3022) in the FRAM data array (3014) during final test. In this example embodiment, one defective row and/or column address may be written into a configuration row (3022) for each segment in the FRAM data array (3014). At power up (step 5008), the repair location information contained in the configuration rows (3022) may be written into the corresponding redundancy words (3003) in redundancy memory cache (3005). Error correcting bits could be added before the corresponding redundancy word is stored (step 5006), in which case the corresponding redundancy word would be read from the memory and written 'as is' into the redundancy memory cache. However, the corresponding redundancy word could be read from the memory and then error correction bits could be formed and added to the corresponding redundancy word before it is written into the redundancy memory cache.

In this example illustration, periphery circuit (3019) sends a memory access request (3008) for data from segment S (3018) in FRAM data array (3014). The redundancy circuit (3002) then selects the corresponding redundancy word (3003) and sends it to the redundancy ECC circuit (3010) for verification. If the redundancy memory cache (3005) is an SRAM array, SER over time may cause bits to lose data (introducing errors into words that are stored in the redundancy memory cache). Therefore, ECC bits (3024) may enable the redundancy word (3003) to be checked for errors and then corrected if needed (step 5010). ECC verification of the corresponding redundancy word (3003) may ensure the validity of the redundancy information. If an error is detected then the redundancy ECC circuit (3010) may correct (step 5012) the corresponding redundancy word (3011) prior to sending it to the address matching circuit (3012). To prevent the accumulation of errors in the redundancy SRAM memory circuit (3002) over time, redundancy data may be periodically checked for—and corrected for—single bit errors using a double error detection (DED) and single error correction (SEC) scheme. If more than one error in a word is found then the data may be reloaded into the redundancy memory cache (3005) from the configuration rows (3022). Therefore, the redundancy ECC circuit (3010) may add an additional level of reliability not found in conventional redundancy schemes.

The corresponding redundancy word (3011) (which may have been error corrected) contains the information regarding the defective row (3019) and/or defective column in the requested FRAM data memory segment (3018). This word (3011) is sent to the address match circuit (3012), which checks to see if the row (3038) or column (3042) repair enable switch is set to "true" and also if the column address (3040) or row address (3036) matches (step 5014) those in the memory access request (3008). Using row repair for illustration, if both the repair enable switch (3038) is set to "true" and the row address (3036) matches the row address in the memory access request (3008), then redundancy switch circuit (3012) redirects (3021) the data request (step 5016) to the redundancy row (3020) in the requested segment (3018). The data may then be sent (3023) to a data error correction circuit (3015) before it is sent (3025) to the periphery circuit (3019). If the row repair enable bit (3038) is set to "false" however, the memory data request is not redirected. Instead, it goes to the address in the memory access request (3008) via data path (3017).

Single row repair is used for purposes of illustration but depending upon the redundancy scheme, multiple rows or columns may be replaced with redundant rows or columns, partial rows or columns may be replaced with partial rows or columns, single bits may be replaced with single bits, or multiple bit clusters may be replaced. If multiple redundant rows or columns or bits are replaced, then each redundancy word (3003) associated with a segment may contain multiple row and column, or bit addresses. Typically the requested data column address (3028) may consist of a single or a few bits. These bits may indicate which word in the memory data segment associated with the accessed row is requested. For example, the requested data column address (3028) indicates whether the requested word to be found in columns 0 to 31 or in columns 32 to 63. Typically, when a defective column replacement is required, any well known column shifting or column replacement technique may be used.

It may be appreciated that the SRAM redundancy circuit (such as 3002 of FIG. 3) may consume less power than a CAM redundancy circuit (such as 2016 of FIG. 2) since only one corresponding redundancy word (3003) to data address comparison (3008) is made by the address match circuit (3012) for each memory access request (3008) instead of the multiple comparisons that occur with each data access in a CAM redundancy scheme (FIG. 2). It may also be appreciated that the SRAM redundancy circuit (such as 3002 of FIG. 3) may have a higher degree of reliability than a CAM redundancy circuit (such as 2016 of FIG. 2) since the SRAM redundancy words may be checked and corrected for errors using ECC prior to completing the memory access request. In a conventional CAM redundancy circuit (such as 2016 of FIG. 2), the data address comparison is done directly with the data stored in the CAM and hence any error in the stored CAM data may result in an incorrect redundancy implementation.

Figure 4:
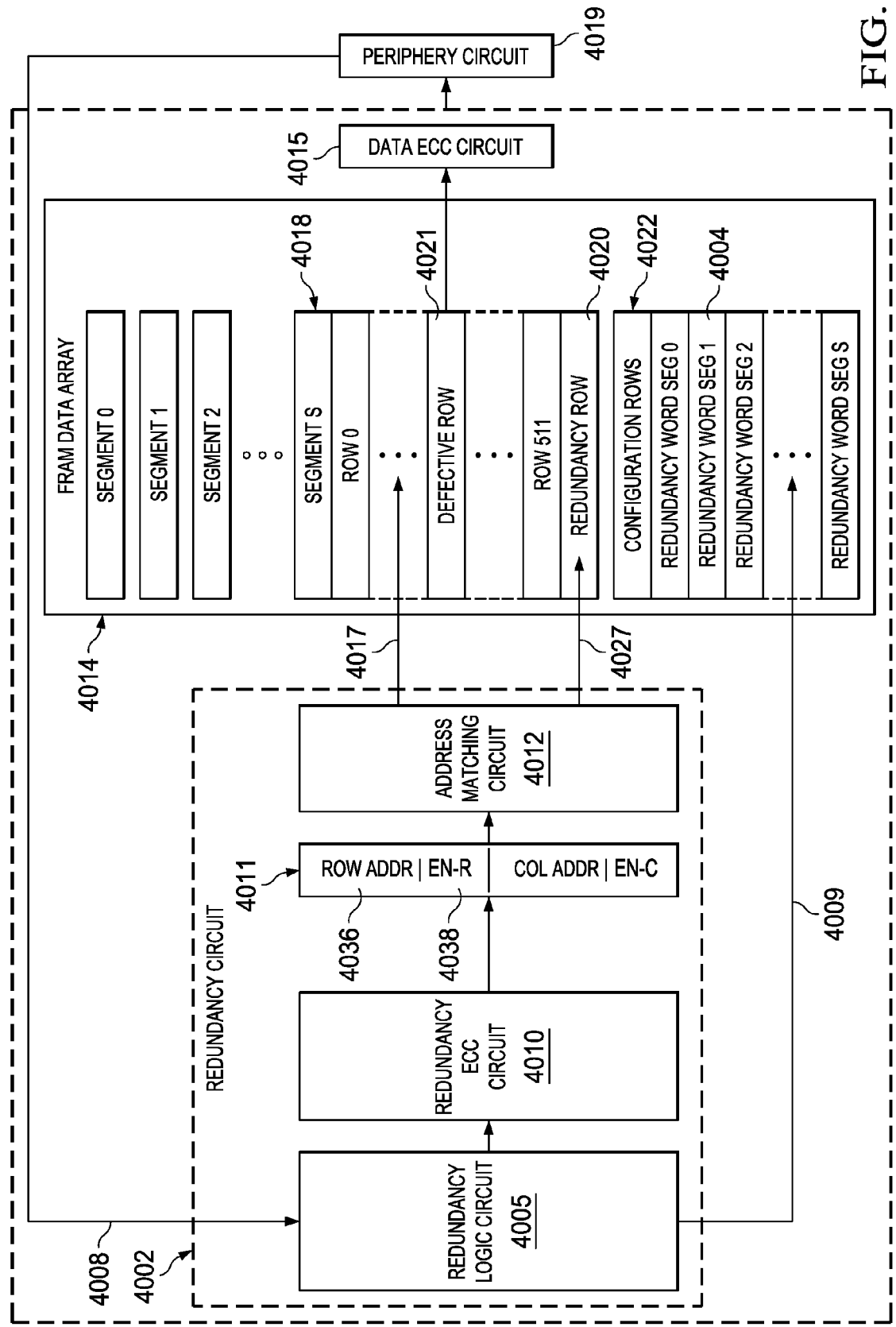
FIG. 4 is a block diagram of an FRAM memory circuit with error correction according to an alternative embodiment.

In the embodiment above, separate memories are used for the redundancy memory. The data array and the redundancy information is written from the data memory into the redundancy memory during power up. In the case of a nonvolatile memory, the redundancy checking and memory access may alternatively be accomplished without a separate redundancy memory, as shown in FIG. 4. The alternative embodiment illustrated in FIG. 4 may have slower memory access time because two memory accesses are needed. Although memory access time may be slowed because two memory accesses are needed, the alternative embodiment illustrated in FIG. 4 may consume less power by eliminating the separate redundancy memory (thereby eliminating the standby current (SRAM) or refresh charging current (DRAM) of the redundancy memory and also eliminating the redundancy ECC circuitry). For example, power may be saved in the alternative embodiment because the ECC circuitry that is used to correct data memory words may be also be used to check the redundancy word. One example of how the data memory may be shared with the redundancy memory would be if they share rows and columns of memory in the same memory array. Another example would be if one or more of the segments in the data array is dedicated for use by the redundancy circuit and used for storing redundancy information. An example of separate data and redundancy memories is where the redundancy memory is a different memory type than the data memory, such as an SRAM redundancy memory and a FRAM data memory.

Figure 6:
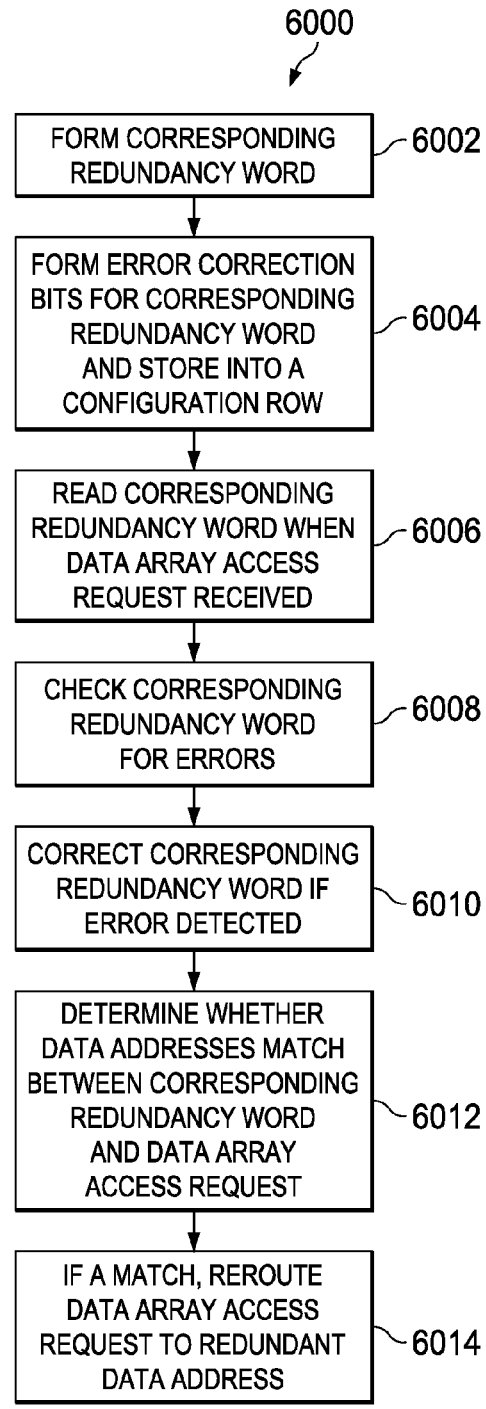
FIG. 6 is a method for operating the FRAM memory circuit with error correction that is shown in FIG. 4.

In the example circuit and method shown in FIGS. 4 and 6, the corresponding redundancy words (4004) are stored and accessed (steps 6002 and 6004) directly from the configuration rows (4022) in the FRAM data array (4014). When the first memory access request (4008) is received (step 6006), it is directed by redundancy logic circuit (4005) to the appropriate corresponding redundancy word (4004) in the configuration rows (4022). The redundancy logic circuit (4005) then sends the corresponding redundancy word (4004) to the ECC circuit (4010) for verification (step 6008) and correction (if needed, step 6010) prior to being sent to the address matching circuit (4012). If the repair enable bit (4038) in the error corrected redundancy word (4011) is set to true and if the row address (4036) matches (step 6012) the row address in the memory access request (4008) then the redundancy switch circuit (4012) redirects (4027, step 6014) the memory access request (a second memory access) away from the row containing defective data (4021) and to the redundant data row (4020) (which contains valid data). Alternatively, if the repair enable bit 4038 is set to false, then the memory access request (4008) is passed along data path (4017) to the address in the memory access request (4008).

It is to be noted that in the example circuit and method of FIGS. 4 and 6 that corresponding redundancy words that include ECC bits could be formed and written into the nonvolatile memory. Alternatively, the corresponding redundancy words could be formed and written into nonvolatile memory and later read from the nonvolatile memory, and then the ECC bits could be added before writing to a volatile memory.

In the embodiments described above, the ECC bits for the bad data array address were generated at the time of generating the corresponding redundancy word during final test. Another option is to construct the ECC bits at the time they are loaded into the redundancy memory circuit during power-up.

In FIGS. 3 and 4 configuration rows (3022) and (4022) are shown to be together, but they may be distributed among the various segments. For example, a memory segment may contain 514 rows consisting of 512 data rows, one redundancy row, and one configuration row.

It is well known that SRAM and DRAM are volatile random access memories that are many times reprogrammable and lose their data when powered down. FRAM, FLASH, EPROM, EEPROM, MRAM, and phase change memory, PCM, are many times reprogrammable nonvolatile random access memories that retain their data when powered-down. E-fuses and antifuses are one time programmable nonvolatile memories.

The terms such as ECC, ECC verification circuit, ECC circuit, etc. all refer to an error correction circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a data array coupled to a data error correction circuit;
   a reprogrammable redundancy memory cache coupled to said data array, said reprogrammable redundancy memory cache being physically separate from said data array; and
   a redundancy error correction circuit coupled to said reprogrammable redundancy memory cache, said redundancy error correction circuit capable of checking or correcting a row address, a column address, or a bit address within a redundancy word stored in said reprogrammable redundancy memory cache; said redundancy error correction circuit being physically separate from said data error correction circuit.

2. The integrated circuit of claim 1 where said data array is an FRAM, FLASH, EPROM, EEPROM, MRAM, PCM, SRAM, or DRAM memory.

3. The integrated circuit of claim 1 where said reprogrammable redundancy memory cache is an FRAM, FLASH, EPROM, EEPROM, MRAM, PCM, SRAM, or DRAM memory.

4. An integrated circuit, comprising:
   an FRAM data array;
   an SRAM redundancy memory cache coupled to said FRAM data array; and
   a redundancy error correction circuit coupled to said SRAM redundancy memory cache, said redundancy error correction circuit capable of checking or correcting a row address, a column address, or a bit address within a redundancy word stored in said SRAM redundancy memory cache.

5. A method for operating an integrated circuit containing a data array, comprising:
   forming a corresponding redundancy word for a data memory segment in said data array where said corresponding redundancy word contains a bad data address;
   storing said corresponding redundancy word in a nonvolatile memory;
   forming error correcting bits for said corresponding redundancy word;
   writing said corresponding redundancy word with error correcting bits into a redundancy memory circuit upon power up of said integrated circuit;
   checking said corresponding redundancy word for errors using a redundancy error correction circuit upon receiving a data array access request for said data memory segment;
   correcting said corresponding redundancy word when an error is detected by said error correction circuit;
   determining if there is a match between a data address in said corresponding redundancy word and a data address in said data array access request; and
   rerouting said data array access request to a redundant data address in said data array when there is said match.

6. The method of claim 5 further comprising;
   reading said corresponding redundancy word from a configuration row in said data array prior to said writing; and
   where said data array is said nonvolatile memory.

7. The method of claim 6 where said nonvolatile memory is an FRAM, FLASH, EPROM, EEPROM, MRAM, or PCM memory.

8. The method of claim 5 further comprising;
   reading said corresponding redundancy word from e-fuses prior to said writing; and
   where said data array is a volatile memory.

9. The method of claim 8 where said volatile memory is at least one of an SRAM and a DRAM.

10. The method of claim 5 where said data array is an FRAM data array and said redundancy memory circuit is an SRAM redundancy memory circuit.

11. The method of claim 5 further comprising:
    writing said error correction bits along with said corresponding redundancy word into said nonvolatile memory.

12. The method of claim 5 further comprising:
    reading said corresponding redundancy word from said nonvolatile memory prior to forming said error correction bits and prior to said writing.

13. A method for operating an integrated circuit containing a data array, comprising:
    forming a corresponding redundancy word for a data memory segment in said data array;
    forming error correction bits for said corresponding redundancy word;
    writing said corresponding redundancy word with said error correction bits into a configuration row in said data array;
    reading said corresponding redundancy word from said configuration row upon receiving a data array access request for said data memory segment;
    checking said corresponding redundancy word for errors using an error correction circuit;
    correcting said corresponding redundancy word when an error is detected by said error correction circuit;

determining if there is a match between a data address in said corresponding redundancy word and a data address in said data array access request; and rerouting said data array access request to a redundant data address in said data array when there is said match.

14. The method of claim 13 further comprising;

writing said corresponding redundancy word into a nonvolatile memory;

reading said corresponding redundancy word from a nonvolatile memory prior to said writing said corresponding redundancy word with said error correction bits into said configuration row in said data array; and where said data array is a volatile memory.

15. The method of claim 14 where said data array is an SRAM or a DRAM data array.

16. The method of claim 14 where said nonvolatile memory is an FRAM, FLASH, EPROM, EEPROM, MRAM, PCM, e-fuse or antifuse memory.

17. The method of claim 14 where said data array is an FRAM, FLASH, EPROM, EEPROM, MRAM, PCM, SRAM, or DRAM memory.

18. The method of claim 13 where said error correction circuit is a data error correction circuit.

19. The method of claim 13 where said error correction circuit is a redundancy error correction circuit.

* * * * *